United States Patent [19]

Arnott

[11] Patent Number: 5,335,235
[45] Date of Patent: Aug. 2, 1994

[54] FIFO BASED PARITY GENERATOR

[75] Inventor: Randy M. Arnott, Clinton, Mass.

[73] Assignee: Digital Equipment Corporation, Maynard, Mass.

[21] Appl. No.: 909,875

[22] Filed: Jul. 7, 1992

[51] Int. Cl.⁵ ............................................. G06F 11/00
[52] U.S. Cl. .................................. 371/49.2; 371/49.1
[58] Field of Search .................... 371/49.1, 49.2, 37.7, 371/38.1, 44

[56] References Cited

U.S. PATENT DOCUMENTS

| | | | |
|---|---|---|---|
| 4,538,271 | 8/1985 | Kohs | 371/49.2 |
| 5,195,093 | 3/1993 | Tarrab et al. | 371/49.1 |

*Primary Examiner*—Vincent P. Canney
*Attorney, Agent, or Firm*—Kenyon & Kenyon

[57] ABSTRACT

A flexible and implementation efficient logic circuit for a FIFO based parity generator, for generating parity blocks for use in a computer system. The logic circuit being capable of generating a data block resulting from an XOR of logic "0" with every bit in the first of a series of data blocks and storing the resulting data block in a FIFO data structure. The contents of the stored block of data may then be XORed with the contents of subsequent blocks of data with the result being stored in the FIFO data structure. The stored data, which represents the parity block generated from the series of data blocks supplied to the FIFO based parity generator, may be read out of the FIFO based parity generator over a series of clock cycles. The logic circuit of the present invention may also be used as a temporary storage media or as a logical zero generator. To use the logic circuit of the present invention as a temporary storage media, a block of data is XORed with logical "0"'s and stored in the FIFO data structure of the logic circuit the same as a first block of data. The data is then read out of the FIFO data structure before additional data is written to the FIFO data structure. To use the logic circuit of the present invention as a logical zero generator, a read operation is performed when the FIFO data structure is empty.

25 Claims, 6 Drawing Sheets

FIG. 4
LOADING FIRST DATA BLOCK (DATA X OR 0 WITH "0")

FIG. 5
LOADING OF SECOND AND SUBSEQUENT DATA BLOCKS

FIG. 6
READING RESULT OF X OR O DATA BLOCKS

FIFO BASED PARITY GENERATOR

FIELD OF THE INVENTION

The present invention is directed to parity generators and, in particular, to a logic circuit for a flexible and implementation efficient first in, first out based parity generator to generate parity blocks for use in a computer system.

BACKGROUND OF THE INVENTION

Modern computer systems often comprise several data storage devices, e.g. an array of independent disk drives. Whenever data storage devices are present in a computer system, data integrity becomes important. To insure data integrity and protect against data loss, parity protection schemes are frequently employed.

In a parity protection scheme, data to be protected are first divided into blocks of data, e.g., blocks of four eight bit words. The data blocks may be further arranged into data groups where each data group may comprise a fixed number of data blocks. For example, each data group may comprise 4 data blocks. The data blocks which comprise a data group may be arranged to form a one dimensional array of data blocks. Thus, a single data group may be viewed as a one dimensional array of data blocks.

Each data block of a particular data group may be stored, e.g., on a different storage device, e.g., a disk drive, with data blocks from several different data groups being stored on a single disk drive. Accordingly, a plurality of data groups, which each comprise a series of data blocks, may be stored in a one dimensional array of data storage devices, e.g., an array of disk drives.

In a one dimensional parity ("1-d parity") protection scheme, which is the simplest form of parity protection, a parity block is generated for each individual data group. The parity block for each data group, which is used to protect against data loss and insure data integrity, may be stored on one of the data storage devices, of the particular array of storage devices, which contains the data group that the parity block is intended to protect.

Thus, in an array of 5 storage devices, 4 data storage devices may, e.g., be used to store data blocks while the fifth data storage device may be used to store parity blocks. For example, when implementing a one dimensional parity scheme, an array of 5 disk drives may be used to store, e.g., 5 data groups where each data group comprises 4 data blocks. In such a case, the first through fourth disk drives in the array of 5 disk drives may each be used to store one data block from each of the 5 data groups., i.e., 5 data blocks per disk drive. The fifth disk drive in the array may be used to store one parity block for each data group, i.e., 5 parity blocks.

The parity block for a particular data group is generated by XORing the contents of each data block, of the particular data group, with the contents of all the other data blocks in the data group to create the parity block for that particular data group. For example, the contents of each data block, in a data group comprising four data blocks, could be XORed with each other to form a single parity block. This parity block may then be stored on a storage device, e.g. the fifth storage device or disk drive in the array of storage devices.

Then, in the event that the data contained in a data block of any one of the data storage devices in the particular data group becomes lost or corrupted, the missing data may be re-generated by XORing the contents of all the intact data storage devices in the particular data group, with the parity block for that data group.

For example, if the contents of the third data block, in the data group comprising four data blocks, became lost or corrupted, the contents of the third data block could be re-generated by XORing the contents of the first, second and fourth data blocks together with the parity block associated with the particular data group.

One known system for generating a parity block, reads words of data from all the storage devices, in an array of storage devices such as disk drives, at the same time and then transmits the data in parallel to a parity generator. The parity generator then XOR's all the words of data together to form a word of the parity block.

This process is repeated for each word of data stored in the data blocks of the data group, until a full parity block is generated from the data blocks. The output of the parity generator is then stored in another data storage device which stores the words of data comprising the parity block for the particular data group.

While the above system processes the data quickly due to the parallel reads from all data blocks in a data group, it doesn't scale easily and becomes impractical to implement for arrays with a large number of data storage devices. For example, in the known system, an array with five data storage devices in a data group, storing eight bit words of data, requires a 40 bit data bus to implement a 1-d parity scheme wherein a word of data from each storage device is transmitted in parallel to the parity generator. However, an array with 20 data storage devices in a data group requires a 160 bit data bus to implement a 1-d parity scheme making the known system impractical due to excessive complexity and implementation cost.

Another disadvantage of the known system is that additional storage devices, containing additional data blocks, may not be added to the system while it is running. Thus, a system shut down is required to change, remove or add storage devices.

In addition to the above known method for implementing a parity generator through the use of hardware, known software products provide for parity generation through the use of software on a host computer. While software implementations of parity generators are the least expensive and most flexible method of implementing such systems, they tend to severely limit system performance. For example, current high performance central processing units ("CPU's") can only perform the parity generation function at several Mb/sec, while a parity generator implemented in hardware can easily perform the parity generation function at speeds exceeding 100 Mb/sec. Thus, such software based parity generators are impractical where rapid system performance is an important consideration.

SUMMARY OF THE PRESENT INVENTION

The present invention provides a new and improved method and apparatus for a flexible and implementation efficient logic circuit for a first in first out ("FIFO") based parity generator, to generate parity blocks for use in a computer system. The logic circuit of the present invention may also be used as a temporary storage media or as a zero generator.

The FIFO based parity generator of the present invention is a flexible high performance parity generator which may be used to generate parity blocks for implementing any type of parity scheme. Furthermore, it can operate with data blocks of any size upto the maximum size of a FIFO data structure which comprises the FIFO based parity generator of the present invention. However, data blocks in a particular data group, from which a parity block is to be generated by the parity generator of the present invention, are of the same size.

The FIFO based parity generator of the present invention may be coupled to a general purpose data bus within a computer system. In addition to the data bus, the computer system may comprise e.g., a CPU, a series of disk drive controllers, and other input/output ("I/O") devices which may be coupled to the general purpose data bus. Each of the disk drive controllers may in turn be coupled to a data storage device which may be used, e.g., to store both data and parity blocks.

The FIFO based parity generator of the present invention supports several functions in relation to parity generation and data regeneration. In the exemplary embodiment described below, one function of the FIFO based parity generator is to load the first block of data into a FIFO data structure. This function, i.e. loading of the first data block into the FIFO data structure, is accomplished by generating an XOR of logic "0" with every bit of each data item, e.g. a word of data, in the first of a series of data blocks, and then storing a resulting parity block in the FIFO data structure.

Another function of the FIFO based parity generator of the present invention is to XOR every bit in the block of data stored in the FIFO data structure, which was generated from the previous XORing operations, with every bit of each word of a current block of data, which is supplied to the parity generator subsequent to the first block of data. The result of this XOR operation is stored in the FIFO data structure for XORing, in the above manner, with the words of other subsequent data blocks from which the parity block is to be generated.

Yet another function of the FIFO based parity generator is to supply the resultant block of XORed data, i.e. the parity block, back to the data bus when requested. Thus, data blocks stored in an array of data storage devices may be supplied via the bus, to the parity generator of the present invention. A parity block may be generated from these data blocks, and read out of the FIFO data structure of the present invention at a later time, to be used or stored by the computer system.

Generally, the FIFO based parity generator of the present invention comprises a series of M one bit parity circuits, wherein the number M corresponds to the number of bits that comprise each word of data of a particular data block. For example, where a data block comprises four eight bit words, M would be 8. The series of M one bit parity generator circuits operate in parallel to generate a parity block from the data words, which are supplied sequentially, via the data bus.

While the present invention reads all bits in a word of data in parallel, the parity generator of the present invention does not read or process words of data from all data blocks, of a particular data group, in parallel. Thus, the size of the data bus required to supply the data to the parity generator does not depend on the number of data blocks in a data group but on the size of the words of data stored in the data blocks of a particular data group. Accordingly, the number of bits, M, per word of data, determines the number of data lines required to implement the data bus required by the parity generator of the present invention.

Thus, the size of the data bus required by the parity generator of the present invention is independent of both the number of data blocks in each data group and the number of words per data block. This permits the FIFO based parity generator of the present invention to be used to implement a parity scheme with parity groups and data blocks of any size, without an excessive number of data lines being required.

Furthermore, since the FIFO based parity generator of the present invention generates a parity block from any number of data blocks via sequential reads of data from the individual data blocks, data storage devices may be added to or removed from the system while it is still operating, with the parity generator still being capable of generating a parity block from the data blocks which are present in the system at any given time.

In addition to being used to generate parity blocks, the FIFO based parity generator of the present invention may be used as a temporary storage media, for use, e.g., during memory to memory copies or it may be used as a logical zero generator for use, e.g., in initializing memory.

To use the FIFO based parity generator of the present invention as a temporary storage media, the data is read into the FIFO based parity generator in the same manner as with a first data block and is stored in the FIFO logic blocks of the one bit parity generator circuits. The incoming data, which is XORed with logical "0"s before being stored in the FIFO logic blocks, remains unaltered and may be retrieved by reading the data in the FIFO data structure contained in the FIFO logic blocks at a later time.

As noted above, the parity generator of the present invention may also be used as a logical zero generator for initializing memory. When there is no data in the FIFO logic blocks the output of the FIFO logic blocks will go to logical "0" during a read operation. Thus, by performing a FIFO read operation when there is no data stored in the FIFO logic blocks, words of data having the value logical "0", will be supplied to the data bus. These words of data may be used to initialize memory to logical "0".

DETAILED DESCRIPTION OF THE DRAWINGS

Figure 1:
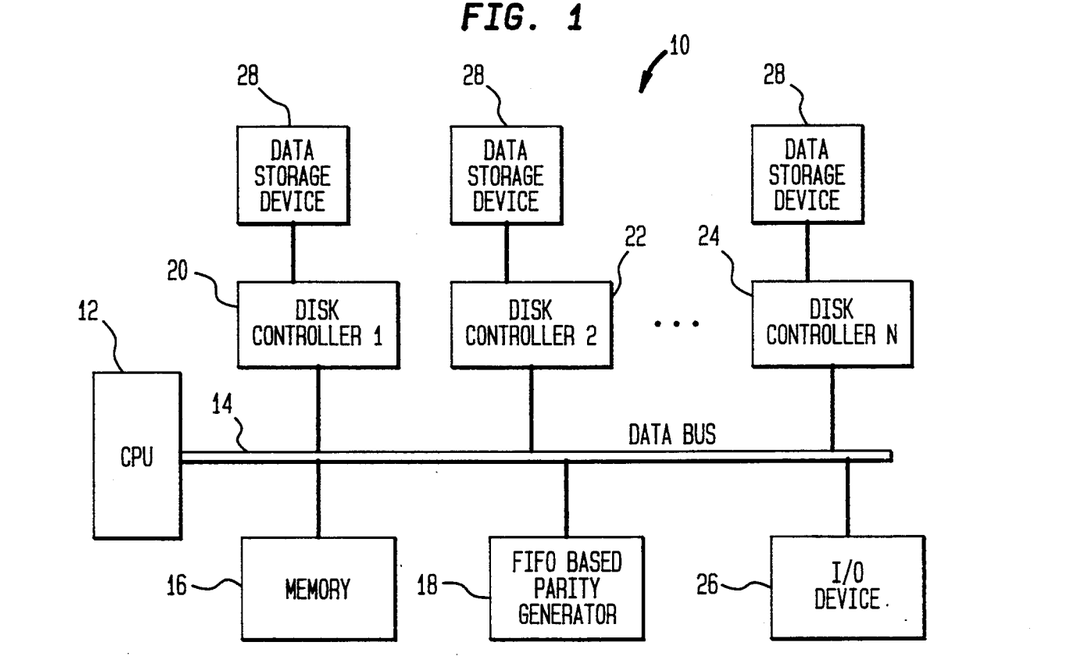
FIG. 1 is a block diagram of a computer system incorporating the FIFO based parity generator of the present invention.

Referring now to the drawings, and initially to FIG. 1, there is illustrated a computer system generally indicated by the reference numeral 10. The computer system 10 comprises a central processing unit ("CPU") 12, a bus 14, a block of memory 16, an I/O device 26, a series of disk controllers 20, 22, 24, a series of data storage devices 28 and a FIFO based parity generator 18, according to the present invention.

Each data storage device 28 is coupled to one of the disk controllers 20, 22, 24 which, in turn, is coupled to the bus 14. Each data storage device 28 comprises a number of disk drives which may be used for storing either data or parity blocks.

The bus 14 is coupled to the other devices 12, 16, 18, 26 comprising the computer system 10, providing a mechanism for the devices 12, 16, 18, 26 to exchange data and control information.

The FIFO based parity generator 18 of the present invention is assigned an address in the I/O data space of the computer system 10 and thus data can be read from or written to the parity generator 18 via the bus 14.

The FIFO based parity generator 18 may be used to generate parity blocks corresponding to any K number of data blocks. The parity blocks generated may be used in combination with any parity scheme, to protect against data loss and to insure the integrity of the data stored in the storage device 28. The parity blocks generated by the FIFO based parity generator 18 may be stored on disk drives of the data storage device 28.

Figure 2:
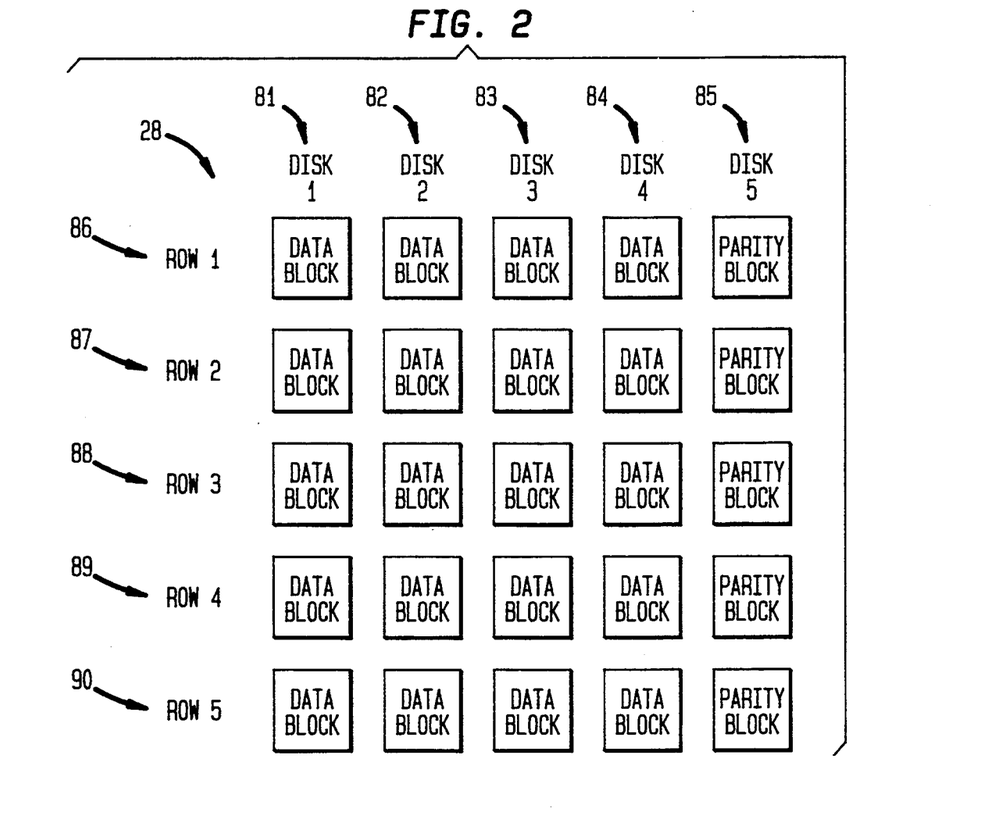
FIG. 2 is a block diagram of a group of data storage devices.

FIG. 2 is a block diagram illustrating an exemplary embodiment of any one of the data storage devices 28 of FIG. 1 and the implementation of a parity protection scheme for a redundant array of independent disk drives ("RAID"), refereed to as RAID 4, wherein a single parity block is used to protect the data blocks of each data group stored on the array of disk drives. The data storage device 28 comprises a series of five disk drives 81, 82, 83, 84, 85, represented by columns 1 through 5 of FIG. 2. Each disk drive 81, 82, 83, 83, 85, of the data storage device 28, is capable of storing several blocks of data, e.g., five data blocks each, as illustrated by the first through fifth rows 86, 87, 88, 89, 90 of FIG. 2.

The blocks of data stored by the five disk drivers 81, 82, 83, 84, 85 may comprise either data blocks or parity blocks, as may be required by the parity scheme being implemented. Each block of data may comprise words of data, with each word of data comprising a predetermined M number of bits. For example, the data blocks may comprise words of data having 8 bits per word, 16 bits per word or 32 bits per word.

In FIG. 2, in accordance with the RAID 4 parity protection scheme being implemented, each one of the first through fourth disk drives 81, 82, 83, 84 is used to store 5 data blocks each, each one of the five data blocks being from a different one of a first through fifth data group. Accordingly, the 20 data blocks which comprise the five data groups are stored on the first thru fourth disk drives 81, 82, 83, 84 while the fifth disk drive 85 is used to store the five parity blocks generated from the five different data groups. Accordingly, each one of the five rows 86, 87, 88, 89, 90 illustrates the four data blocks, that comprise one of the five data groups, and the parity block associated with the particular data group.

Figures 3, 3B:
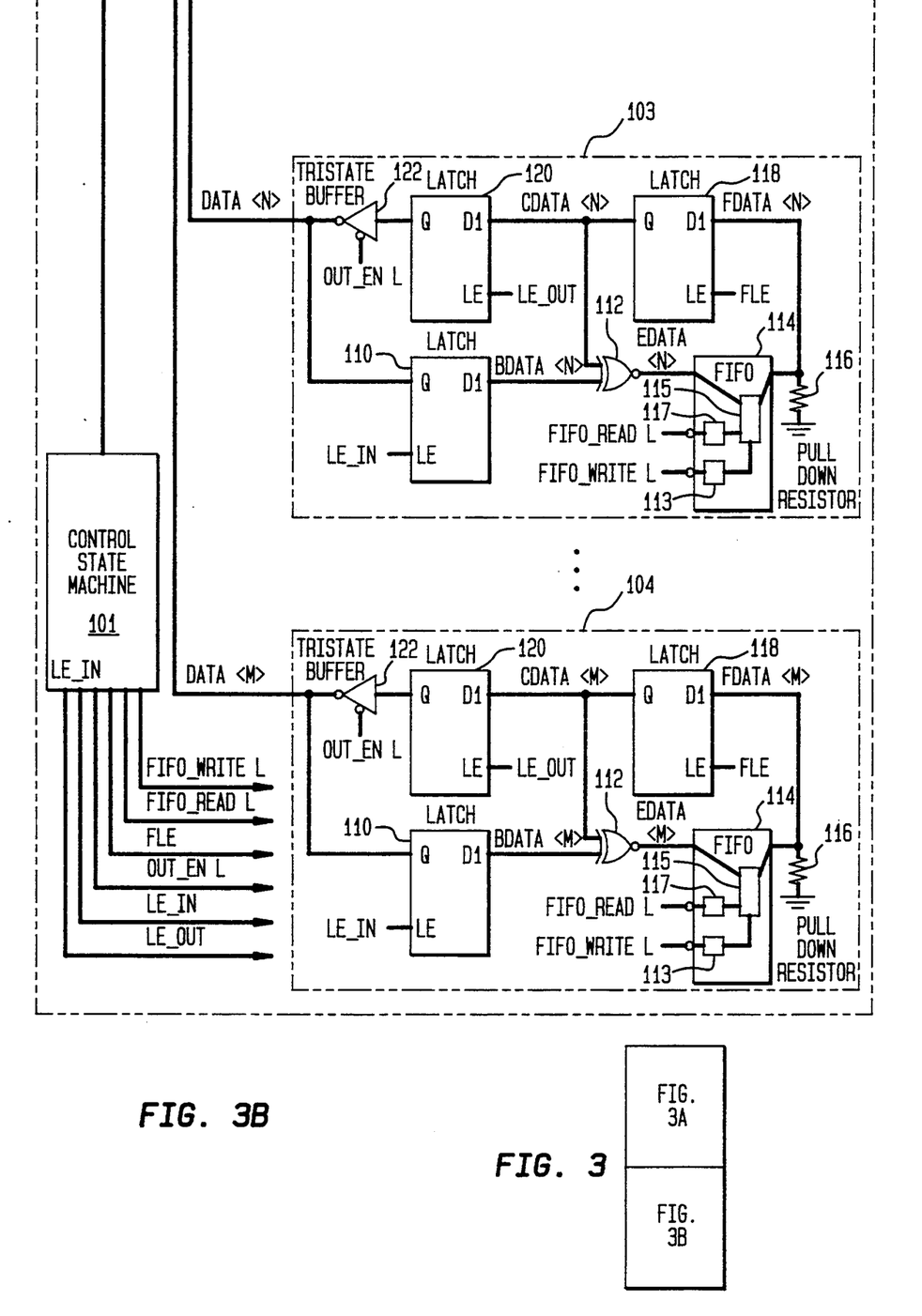
FIG. 3 is an exemplary embodiment of a circuit for implementing the FIFO based parity generator of the present invention.
Figure 3A:
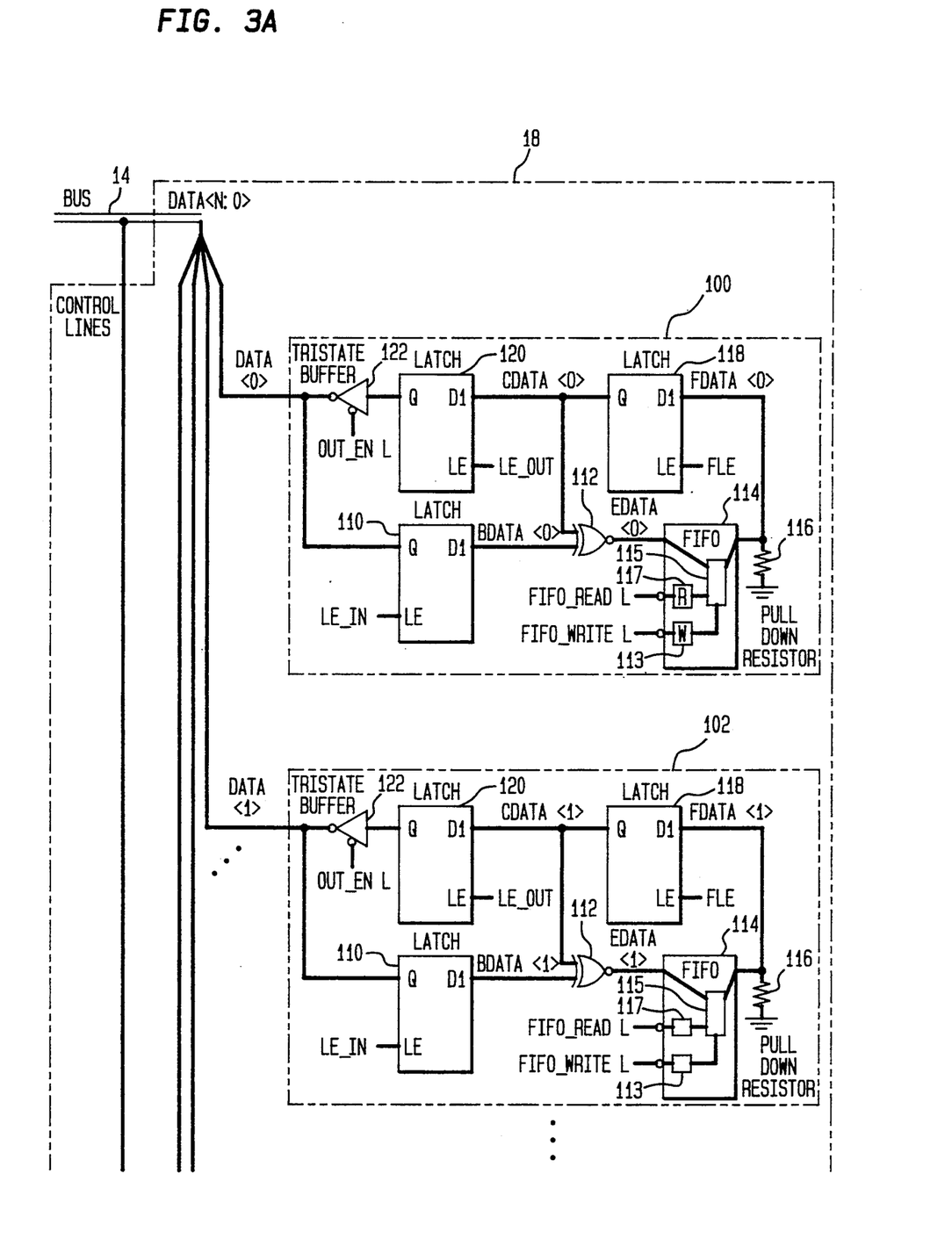

Referring now to FIG. 3, there is illustrated a block diagram of an exemplary circuit for a FIFO based parity generator 18 according to the present invention.

The FIFO based parity generator 18, for generating parity blocks from blocks of data, can be designed to work with blocks of data comprising words of data having any number, M, of bits per word of data. The FIFO based parity generator 18 comprises a control state machine 101 and a series of M one bit parity circuits 100, 102, 103, 104, where M equals the number of bits per word of data stored in the data blocks. Each of the one bit parity generator circuits 100, 102, 103, 104 is used to process a corresponding bit of each word of data stored in the data blocks from which the parity block is to be generated.

The control state machine 101 is coupled to the control and data bus 14 in order to permit the control state machine 101 to monitor the bus 14 for data being supplied to the one bit parity circuits 100, 102, 203, 104 and to permit the control state machine 101 to receive a read from parity generator signal which is asserted by, e.g., the CPU 12, in order to initiate the reading, via the bus 14, of the parity block contained in the FIFO based parity generator 18 of the present invention.

The control state machine 101 has a series of outputs which are coupled to the corresponding signal inputs of the various elements of each one bit parity generator circuit. The control state machine 101 has a latch enable output signal, LE_OUT, output; a latch enable input signal, LE_IN, output; an output enable signal, OUT_ENL, output; a FIFO data latch enable signal, FLE, output; a FIFO read enable signal, FIFO_READL, output; and a FIFO write enable signal, FIFO_WRITEL, output. The output signals of the control state machine 101 are asserted, as a function of the control state machine's input signals and the data supplied to the parity generator 18 via the bus 14, to control the operation of the one bit parity circuits 100, 102, 103, 104 as will be described below.

Each one of the 1 thru M one bit parity circuits 100, 102, 103, 104 is coupled, respectively, to a corresponding one of a 1 thru M data lines of the control and data bus 14. Thus, the bus 14 supplies each one of the one bit parity circuits 100, 102, 103, 104 with one of the 1 thru M bits of data which comprise the words of data stored in the data blocks. The one bit parity circuits 100, 102, 103, 104 work in parallel to simultaneously process the M bits of each word of data received by the parity generator 18 from the data lines of the bus 14.

Each one of the M one bit parity circuits 100, 102, 103, 104 comprises a first latch 110. The latch 110 has a data input coupled to a corresponding line of the 1 thru M data lines of the data bus 14. An LE_IN (latch enable input) signal is applied to an enable input of the first latch 110. In this manner, the $n^{th}$ data line of the data bus 14 is coupled to the first latch 110 of the $n^{th}$ one bit parity circuit 103. Thus, the $n^{th}$ data line supplies the signal DATA$<n>$ as an input signal to the $n^{th}$ one bit parity circuit 103.

A BDATA$<n>$ signal output of the first latch 110 is coupled to an input of an XOR logic gate 112. A CDATA$<n>$ output of a second latch 118 is coupled to a second input of the XOR logic gate 112 and to a data input of a third latch 120. An EDATA$<n>$ output of the XOR gate 112 is coupled to a data input of a FIFO logic block 114. The signal FIFO_READL, which is asserted low active, is applied to a negated FIFO read enable input of the FIFO logic block 114. The FIFO_WRITEL signal which is also asserted low active, is applied to a negated FIFO write enable input of the FIFO logic block 114. The FIFO_READL and FIFO_WRITEL signals are used to control the reading of data from and writing of data to the FIFO logic block 114.

Each FIFO logic block 114 comprises a ring buffer 115, a read address counter 117, and a write address counter 113. Each ring buffer 115 comprises a series of one bit memory locations and has a data signal input, which is coupled to the data signal input of the FIFO logic block 114, a data signal output coupled to an FDATA<n> signal output of the FIFO logic block 114, a write address input and a read address input.

The FIFO logic block's write address counter 113 has a write control signal input and a write address signal output. Similarly, the FIFO logic block's read address counter 117 has a read control signal input and a read address output.

The negated FIFO write enable signal input of the FIFO logic block 114 is coupled to the write control signal input of the write address counter 113. The write address signal output of the address counter 113 is coupled to the write address input of the ring buffer 115. The write address counter 113 outputs the address of the first memory location of the ring buffer 115 in response to the first asserted FIFO_WRITEL signal received from the control state machine 101. Each subsequent assertion of the FIFO_WRITEL signal will cause the write address counter 113 to increment and output the address of the next ring buffer memory location to be written to. When the write address counter 113 reaches the last ring buffer memory location it resets and starts outputting write addresses starting again from the ring buffer's first memory location.

When an address is supplied to the ring buffer's write address input, the ring buffer 115 writes the signal received at its data signal input into the ring buffer memory location specified by the write address which is received.

By repeatedly asserting the FIFO_WRITEL signal, it is possible to traverse the entire ring buffer 115 sequentially writing data into the ring buffer's memory locations in the order in which the data is received, in a manner that is consistent with a FIFO data structure.

The negated FIFO read enable signal input of the FIFO logic block 114 is coupled to the corresponding read control signal input of the read address counter 117. The read address signal output of the read address counter 117 is coupled to the read address input of the ring buffer 115.

The read address counter 117 outputs the address of the first memory location in the ring buffer 115 in response to the first asserted FIFO_READL signal received from the control state machine 101. Each subsequent assertion of the FIFO_READL signal will cause the read address counter 117 to increment and output the address of the next ring buffer memory location to be read from. When the read address counter 117 reaches the last ring buffer memory location it resets and starts outputting read addresses starting again from the ring buffer's first memory location.

By repeatedly asserting the FIFO_READL signal, it is possible to traverse the entire ring buffer 115 sequentially reading data out of the ring buffer's memory locations in the order in which the data was written into the ring buffer 115.

Thus, data is written into and read out from the ring buffer 115 in accordance with a first in first out (FIFO) policy. Accordingly, the ring buffer 115 can be used in conjunction with the read and write address counters 117 113, as a FIFO data structure.

The FDATA<n> signal output of the FIFO logic block 114 is coupled to an FDATA<n> data input of the second latch 118. The latch 118 has an FB_LE (first block latch enable) signal applied to an enable input. As noted above, the CDATA<n> signal output of the second latch 118 is coupled to one of the inputs of the XOR logic gate 112 and to the data input of the third latch 120. A DATAO<n> (data out) signal output of the third latch 120 is coupled to an input of a tri-state buffer 122. A negated enable input of the tri-state buffer 122 is supplied with the signal OUT_ENL, which is asserted low active. The signal OUT_ENL is asserted low active to permit data to be read out from the parity generator 118 and placed on the data bus 14. The output of the tri-state buffer 122 is coupled to $n^{th}$ data line of the bus 14.

Figure 4:
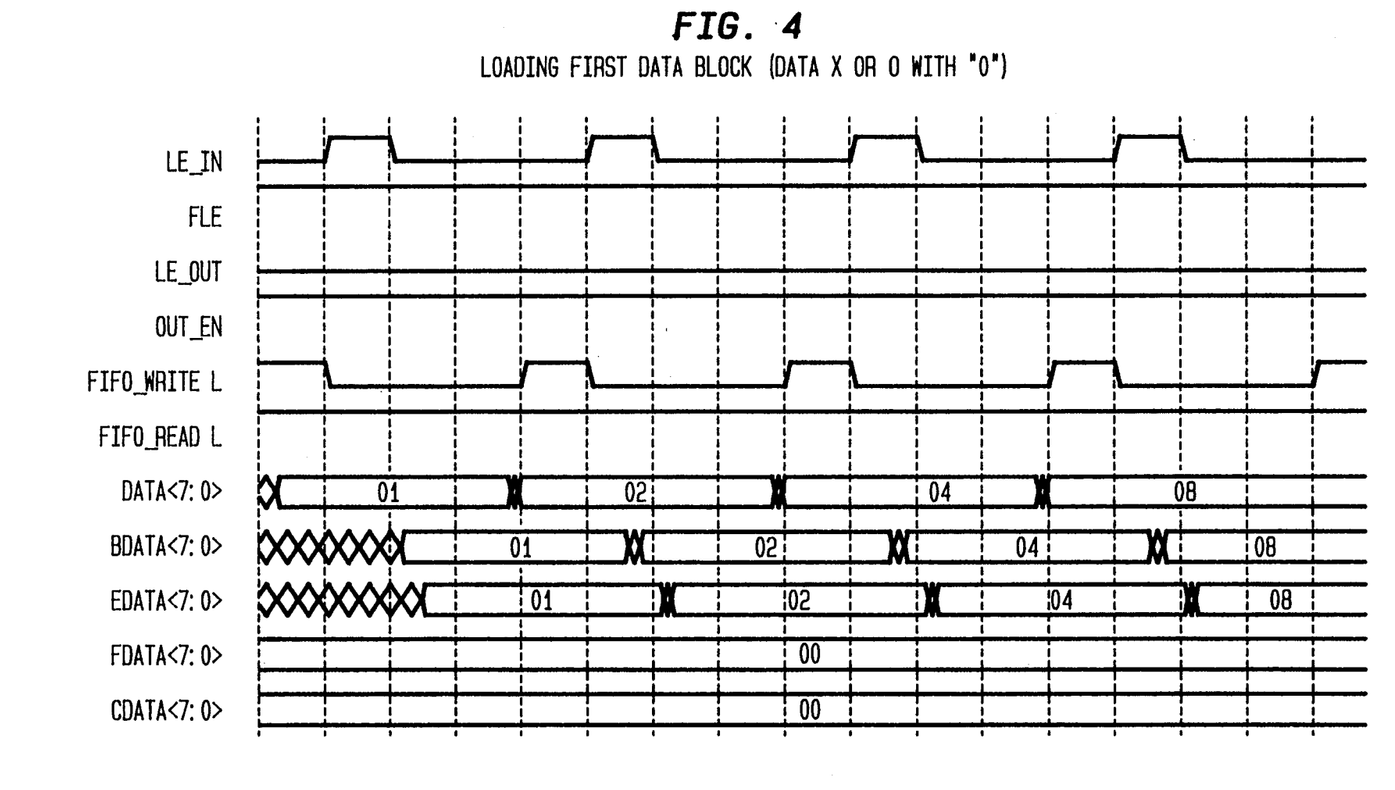
FIG. 4 is a timing diagram illustrating the processing of a first block of data received by the parity generator of FIG. 3.

The operation of the FIFO based parity generator 18 of the present invention, will now be described with reference to the timing diagram of FIG. 4. In FIG. 4, dotted lines are used to indicate the completion of a clock cycle.

FIG. 4 illustrates the operation of the FIFO based parity generator 18 as the parity generator 18 is supplied with the data from a first block of data in a group of data blocks. For the purposes of this example, each data block comprises four words of data, with each word of data comprising eight bits. Since 8 bit words, are the data units from which a parity block must be generated, the parity generator 18 comprises a series of 8 one bit parity generator circuits 100, 102, 103, 104, for purposes of this example.

In accordance with one embodiment of the present invention, the control and data bus 14, which supplies an eight bit data signal DATA<7:0> to the input of the FIF0 based parity generator 18, has each one of its eight data lines <7:0> coupled to a corresponding one of the eight one bit parity generators 100, 102, 103, 104, respectively. Thus, as illustrated in FIG. 3, the $n^{th}$ one bit parity generator 103 is coupled to the $n^{th}$ data line of the bus 14 and is supplied with the one bit input signal DATA<n>.

The signals BDATA<7:0>, EDATA<7:0>, FDATA<7:0>, and CDATA<7:0>, illustrated in FIG. 4, represent the signals BDATA, EDATA, FDATA and CDATA in each of the eight separate one bit parity generators 100, 102, 103, 104 that are used to process the signal DATA<7:0>. Thus, for example, the signal BDATA<7:0> is used to represent the eight individual one bit signals BDATA<7> thru BDATA<0>.

The signal DATA<7:0> represents the data being supplied to the parity generator 18. As illustrated in FIG. 4, the first block of data being loaded into the parity generator 18 comprises the four words of data which have the hexadecimal value 01, 02, 04 and 08, respectively, as represented by the signal DATA<7:0> supplied to the parity generator 18 over a number of cycles, one cycle for each word of the data block.

Prior to the time when the first block of data is supplied to the parity generator 18, the CPU 12 sets a control bit in the control state machine 101 which causes the signal FLE, supplied to the second latch 118 of each of the one bit parity generators 100, 102, 103, 104, to be asserted for the duration of the transaction illustrated in FIG. 4. Thus, the signal FLE remains asserted during the entire time data from the first data block is being supplied to the parity generator 18.

Thus, throughout the entire transaction illustrated in FIG. 4, the second latch 118 of the one bit parity generators 100, 102, 103, 104 is enabled. This permits the data signal FDATA<7:0> which is applied to the second latch's data input terminal to pass through to its CDATA<7:0> output terminal. Since no data are being read from the FIFO logic block 114 for the entire transaction during which the first data block is being processed, as is asserted low active, is kept high throughout the entire transaction, the output of the FIFO logic block 114 goes tristate, i.e. enters a high impedance state where data is not placed on the lines of the data bus by the one bit parity generator circuits 100, 102, 103, 104.

This causes the pulldown resistor 116 to pull the signal FDATA<7:0> to a value of logic "0". Since the second latch 118 is enabled throughout the entire transaction, the second latch's output, the signal CDATA<7:0>, will be equal to the second latches input FDATA<7:0>, i.e. logic "0", during the entire transaction. Thus, the signals FDATA<7:0> and CDATA<7:0> remain low throughout the transaction illustrated in FIG. 4 during which the first data block is loaded into the FIFO based parity generator 18.

The signal LE_IN, is asserted by the control state machine 101 for one clock cycle as a first word of data, 01 hex, as represented by by signal DATA<7:0>, is supplied from the bus 14, to the parity generator 18. The assertion of the signal LE_IN enables the first latch 110 and causes the signal DATA<7:0> to pass through the first latch 110 to the BDATA<7:0> signal output. The signal LE_IN is then de-asserted by the control state machine 101 and remains de-asserted for the next three clock cycles causing the signal DATA<7:0l> to be stored in the first latch 110. Thus, with the de-assertion of the signal LE_EN, the data input to the parity generator 18 is disabled while the word of data, DATA<7:0>, 01 hex, which was received from the bus 14 is processed, i.e. each one bit parity generator circuit XOR's the current bit of the word of data with the bit output by the FIFO logic 114 and the resulting parity bit is stored in the FIFO logic block 114. Once the parity generator 18 has completed processing the first byte of data, the signal LE_IN is re-asserted by the control state machine 101 for a clock cycle as the next word of data, 02 hex, is read into the parity generator 18.

This process of asserting the signal LE_IN to permit the data to be read into the parity generator 18 and then de-asserting it while the data is processed, is repeated until all four of the data words, 01, 02, 04, 08 hex, which comprise the first block of data, have been read in and processed by the parity generator 18.

As noted above, once a word of data is read in by the parity generator 18, the signal DATA<7:0> is passed through the first latch 110 since the signal LE_IN is asserted. Thus, the signal BDATA<7:0> is set equal to the value of the input signal DATA<7:0>, as illustrated in FIG. 4 with BDATA<7:0> assuming the value 01 hex. The signal LE_IN is then de-asserted with the signal BDATA<7:0> being held at the output of the latch 110 until the signal LE_IN is re-asserted.

The signal EDATA<7:0> is generated by XORing the signal BDATA<7:0> with the signal FDATA<7:0> which, as noted above, has the value of logical "0" throughout the entire transaction illustrated in FIG. 4. Thus, while the first block of data is being loaded into the parity generator 18, the signal EDATA<7:0> will always assume the value of the input signal as illustrated by the signal EDATA<7:0> assuming the value 01 hex.

The result of the XOR operation, the signal EDATA<7:0>, is then written into a FIFO data structure contained within the FIFO logic block 114, upon the assertion of the signal FIFO_WRITEL by the control state machine 101. The signal FIFO_WRITEL is asserted during the fourth clock cycle after the input of the word of data to the parity generator 18 in order to store the XOR result, generated by the parity generator 18, in the FIFO data structure, i.e. the memory locations contained in the ring buffer 115, for future use.

With the writing of the result into the FIFO data structure contained in the FIFO logic block 114, the processing of the first word of data, 01 hex, is complete and the signal LE_IN is re-asserted to start the processing of the next word of data, 02 hex.

The cycle described above, which requires 4 clock cycles to load and process each word of data, is repeated until the remaining data, words 02, 04, 08 hex, contained in the first data block, are loaded into the parity generator 18 and stored in the data structure contained in the FIFO logic block 114.

Thus, a total of 16 clock cycles is required to load the four words of data, 01, 02, 04, 08 hex, comprising the first block of data, into the parity generator 18.

With the first block of data loaded into the FIFO, the parity generator 18 proceeds to process the second and all subsequent blocks of data.

Figure 5:
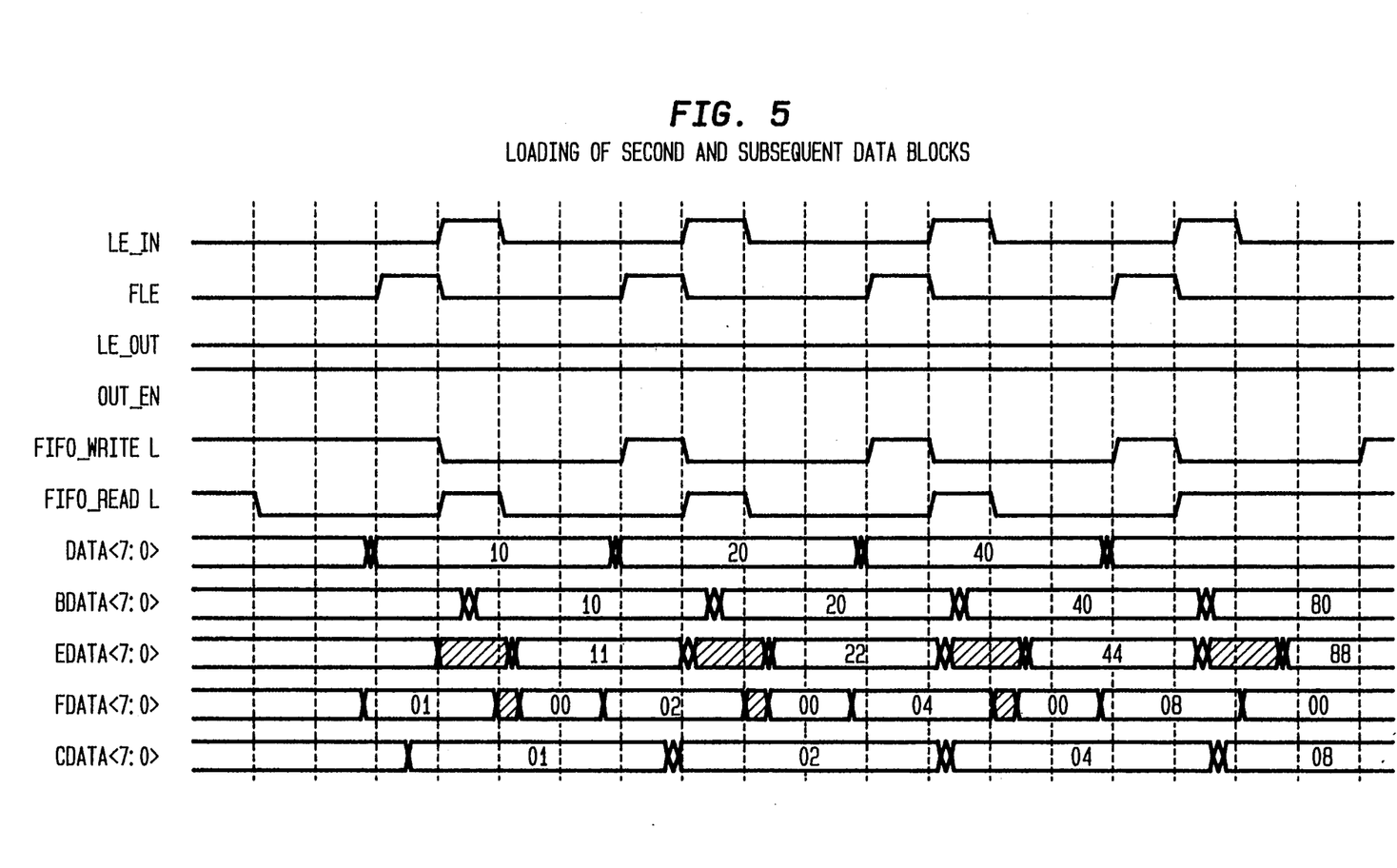
FIG. 5 is a timing diagram illustrating the processing of the second and subsequent blocks of data received by the parity generator of FIG. 3.

FIG. 5 is a timing diagram illustrating the operation of the FIFO based parity generator 18 when loading the remaining, i.e. $2^{nd}$ thru $n^{th}$, data blocks being used to generate the parity block.

Before the sequence illustrated in FIG. 5 begins, the CPU 12 sends a signal to the control state machine 101 causing the control bit, which is used to indicate when the first block of data is being processed, to be reset. Thus, during the sequence illustrated in FIG. 5, the signal FLE will not be asserted throughout the entire transaction but will be asserted only at appropriate times during the processing of the data in order to permit the previous value generated by the FIFO based parity generator 18 and stored in the FIFO data structure to be XORed with the current data being supplied to the parity generator 18. Thus, unlike the sequence in FIG. 4 in which the data from the first data block were XORed with logical "0"'s, the data from the subsequent data blocks are XORed with the parity block residing in the FIFO data structure of the FIFO logic block 114. The parity block being the result of the XOR operations.

In order to XOR incoming data with the data previously stored in the FIFO data structure contained in the FIFO logic block 114, a read of the FIFO data structure must occur before the XOR operation. Accordingly, the assertion of the FIFO_READL signal by the control state machine 101, as illustrated in FIG. 5, causes the FIFO logic block 114 to output data contained in the first location of the FIFO as the signal FDATA<7:0>. This signal is then latched into the second latch 118 with the de-assertion of the signal FLE which is used to enable/disable the latch 118. Thus, the signal FDATA<7:0> is passed through and held at the CDATA<7:0> output of the latch 118.

The signal LE_IN, which enables the input of the byte of data into the parity generator 28, is asserted and deasserted at the same time as the signal FIFO_READL so that the reading in of data to be processed is synchronized with the reading out of data, from the FIFO data structure, which will be XORed with the incoming data, DATA<7:0>. Thus, the signal DATA<7:0> is latched into the first latch 110, at the same time the signal FDATA<7:0> is latched into the second latch 118. The data signal BDATA<7:0>, output by the first latch 110, is then XORed with the signal CDATA<7:0> output by the second latch 118 producing the signal EDATA<7:0>. The signal EDATA<7:0> is then written into the FIFO data structure contained within the FIFO logic block 114, with the assertion of the signal FIFO_WRITEL.

The above sequence is repeated for each word of data in the remaining blocks of data being used to generate the parity block.

From the timing diagram of FIG. 5, which illustrates the above sequence, it can be seen that the data residing in the FIFO data structure (bytes 01, 02, 04, 08 hex) have been read out from the FIFO data structure, over a number of cycles, as the signal FDATA<7:0> which is then latched into the second latch 118. The second latch 118 holds the value as the signal CDATA<7:0> until it can be XORed with the data being simultaneously supplied to the parity generator 18 via the bus 14.

The data being provided to the parity generator 18, the signal DATA<7:0>, (10, 20, 40, 80 hex), which comprises the second data block, is input over a number of cycles to the first latch 110 of the parity generator 18 as illustrated in FIG. 5. The first latch 110 receives the signal DATA<7:0> (10, 20, 40, 80 hex) which is latched into the first latch 110 and output as the signal BDATA<7:0> (10, 20, 40, 80 hex). The signal BDATA<7:0> is XORed with the signal CDATA<7:0> (01, 02, 03, 04 hex) as described above, over a number of cycles, to produce the signal EDATA<7:0> (11, 22, 44, 88 hex) which is written back into the FIFO data structure contained in the FIFO logic block 114.

Any subsequent data blocks will be processed according to the same sequence as described above, for the processing of the second data block.

Figure 6:
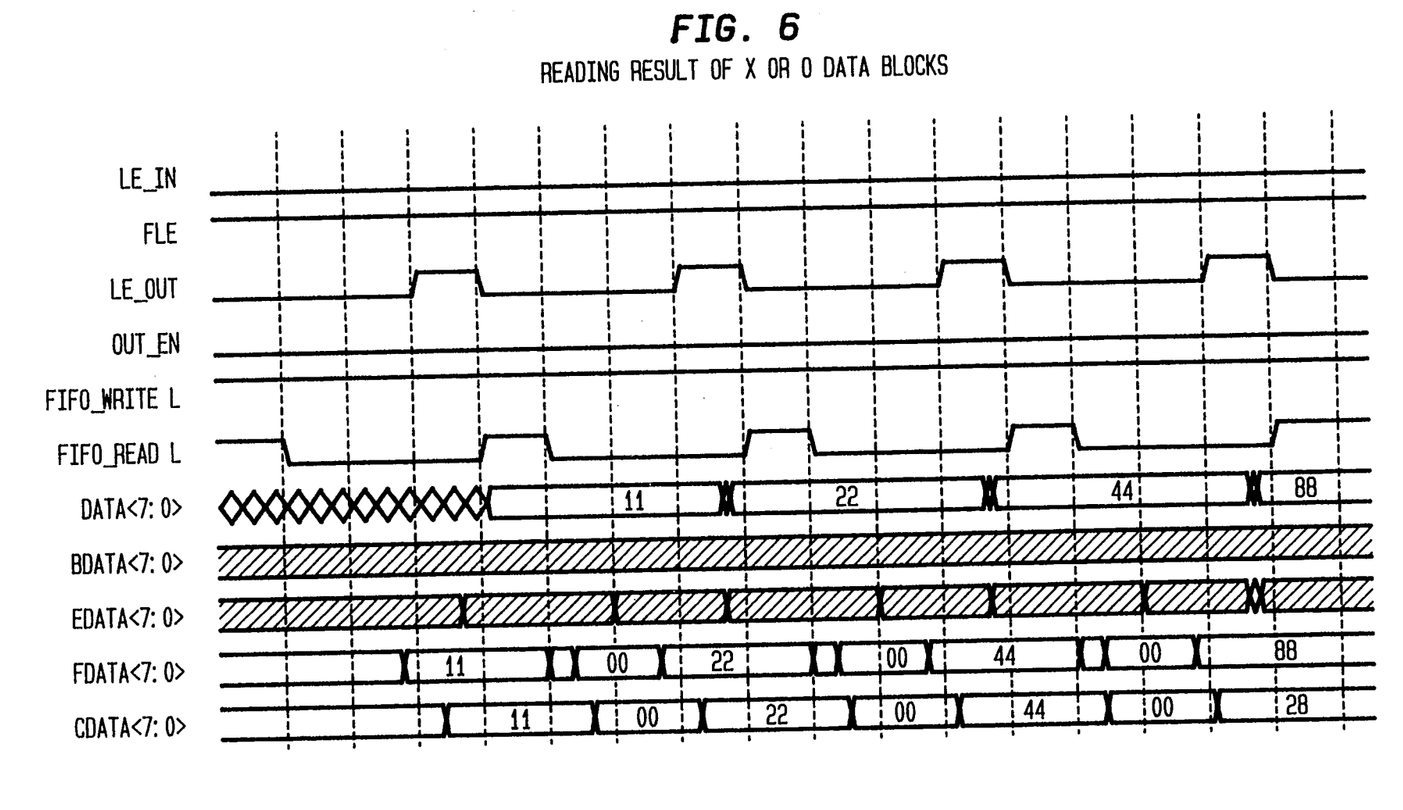
FIG. 6 is a timing diagram illustrating the reading of a parity block generated by the parity generator of FIG. 3.

Referring now to FIG. 6, there is illustrated a timing diagram showing the operation of the FIFO based parity generator 18, when the resulting parity block generated by XORing the data blocks together is being read from the FIFO logic block 114.

During a read operation, as illustrated in FIG. 6, the output enable signal OUT_EN supplied to the tri-state buffer 122, is asserted, low active, by the control state machine 101. This enables the tri-state buffer 122 and permits the signal DATAO<7:0> to be output to the bus 14 forming the signal DATA<7:0> which represents one word of the generated parity block. Each word of the parity block may be transferred via the bus 14 and stored on an appropriate storage device, e.g. one of the disk drives of FIG. 2.

While data is being read from the FIFO logic block 114, the signal LE_IN is held low, as illustrated in FIG. 6. This locks the first latch 110, closing the parity generator's data input path. During a read operation, as opposed to a data input operation, the signals BDATA<7:0> and EDATA<7:0> constitute "don't care" signals since the value of these signals has no effect on the value of the data being output by the parity generator 18. In FIG. 6, this don't care condition is illustrated by the cross hatch marking of the signals BDATA<7:0> and EDATA<7:0>. Furthermore, during the entire read operation, the signal FIFO_WRITEL is held high insuring that the FIFO logic block 114 will not have its write input enabled during the read operation.

During the data read sequence illustrated in FIG. 6, the FIFO_READL signal is asserted, low active by the control state machine 101, at appropriate times as will be described below, enabling the FIFO logic block 114 to output the data contained in the FIFO data structure as the signal FDATA<7:0>. The signal FDATA<7:0> is supplied to the data input of the second latch 118 which is made transparent during the entire read sequence by the assertion of the FLE signal which enables the second latch 118.

The FDATA<7:0> signal input to the latch 118 passes through to the CDATA<7:0> signal output. The signal CDATA<7:0> is latched into the third latch 120 with the assertion of the signal LE_OUT, by the control state machine 101. The signal LE_OUT is then deasserted holding the value of the signal CDATA<7:0> at the DATA0<7:0> output of the third latch 120. The DATAO<7:0> signal is, in turn, supplied to the bus 14 forming the signal DATA<7:0>. With the de-assertion of the signal LE_OUT, the signal FIFO_READL is asserted for a clock cycle disabling the FIFO read output while the previously read piece of data is supplied to the bus 14. In this manner, the data contained in the FIFO logic block 114, which represents the data comprising the parity block, is read out to the bus 14 foxing the signal DATA<7:0> which represents one eight bit word of the parity block.

As with the processing of data supplied to the parity generator 18, the reading out of data contained in the FIFO logic block 114, requires four clock cycles for the one bit parity generators 100, 102, 103, 104 to output the bits of data comprising each word of the parity block.

From the timing diagram illustrated in FIG. 6, it can be seen that the four words of XORed data (11, 22, 44, 88 hex) i.e. the four words of the parity block, have been read out of the FIFO logic block 114, over a number of cycles, as the signal FDATA<7:0> and are then passed through the second latch 118 to form the signal CDATA<7:0>. The signal CDATA<7:0> is in turn latched into the third latch 120 and passed out onto the bus as the signal DATA<7:0> via the tri-state buffer 122. Thus, in this manner, the four words of data (11, 22, 44, 88 hex), comprising the parity block stored in the FIFO logic block 114, are passed out onto the bus 14 as the signal DATA<7:0 >(11, 22, 44, 88 hex) over a period of 16 clock cycles with 4 clock cycles being required to pass out each eight bit word of data being read out to the bus 14.

As described above, the FIFO based parity generator 18 of the present invention provides a flexible high performance parity generation method. The parity generator of the present invention is readily adaptable for use with any number of storage devices and may be used to efficiently implement any type of parity protection scheme.

While the above circuit illustrated in FIG. 3 may be used as a parity generator, it may serve a number of other functions as well. For example, the circuit of FIG. 3 can be used as a temporary storage media, for use e.g., during memory to memory copies, or it may be used as a logical zero generator for use, e.g., in initializing memory.

To use the circuit of FIG. 3, as a temporary storage media, the CPU 12 sends a signal to the control state machine 101 causing the control bit, which indicates that it is the first block of data being input into the parity generator 18, to be set. This prevents the previously stored data from wrapping around and being XORed with the incoming data. Thus, the data is processed in the same manner as with a first block of data being stored in the FIFO logic block 114, e.g. as illustrated in FIG. 4. The incoming data which is XORed with logical "0"'s, before being stored in the FIFO logic block 114 remains unaltered and may be retrieved by reading the data in the FIFO data structure contained in the logic block 114 at a later time as illustrated by the timing diagram of FIG. 6.

As noted above, the parity generator 18, may also be used as a logical zero generator for initializing memory. When there is no data in the FIFO logic block 114, the output of the parity generator 18 will go tristate during a read operation. This allows the pulldown resistor 116 to drive logical "0"'s as the DATA<7:0> output signal supplied to the bus 14. Thus, the signal DATA<7:0> which has all its bits set to logical "0" may be used to initialize memory to logical "0"

When reading the resulting parity block from the FIFO, the resulting parity block is output to the data bus in the form of words of data which comprise the signal DATA<7:0>, which in this case, will have the value logical zero.

I claim:

1. A parity generator for generating a block of m parity bits from a series of K data blocks, each one of the K data blocks comprising a series of m bits, the parity generator comprising:
   an XOR logic device having first and second inputs and an output, the first input coupled to the K data blocks to receive one of the m bits;
   a parity bit storage device comprising a series of m one bit memory locations arranged as a FIFO data structure, the parity bit storage device having an output coupled to the second input of the XOR logic device and an input coupled to the output of the XOR logic device;
   a write/read address generator coupled to the storage device, the write/read address generator having a read control input and a write control input;
   the write control input adapted to receive a FIFO write signal that causes the write/read address generator to control the storage device to store a signal output by the XOR logic device, in the storage device in the FIFO manner, the signal comprising the logical result of XORing the first and second XOR inputs to provide a parity bit signal;
   the read control input adapted to receive a FIFO read signal that causes the write/read address generator to control the storage device to output the parity bit signal stored in the storage device, in the FIFO manner.

2. The parity generator of claim 1, further comprising a buffer coupled to the output of the parity bit storage device.

3. The parity generator of claim 2, further comprising a first latch coupling the K data blocks to the first input of the XOR logic device.

4. The parity generator of claim 3, further comprising a second latch coupling the output of the parity bit storage device to the second input of the XOR logic device and to the buffer.

5. The parity generator of claim 4, further comprising a third latch coupling the second latch to the buffer.

6. The parity generator of claim 5, further comprising a state machine for generating signals for enabling and de-enabling the first, second, and third latches.

7. The parity generator of claim 6, further comprising a bus coupling the K data blocks to the first input of the XOR logic device and to the third latch.

8. The parity generator of claim 5, further comprising a state machine for generating signals for enabling and de-enabling the first, second, and third latches and for asserting and de-asserting the FIFO write and FIFO read signals to cause each one of the m bits of the first K data block to be XORed with a logical zero output by the parity storage device.

9. A parity generator for generating a block of m parity bits from a series of K data blocks, each one of the K data blocks comprising a series of m bits, the m bits of each data block being arranged to form P words, each word having n bits, the parity generator including n circuits with each circuit comprising:
   an XOR logic device having first and second inputs and an output, the first input coupled to the P words of the K data blocks to receive one of the n bits;
   a parity bit storage device comprising a series of P one bit memory locations arranged as a FIFO data structure, the parity bit storage device having an output coupled to the second input of the XOR logic device and an input coupled to the output of the XOR logic device;
   a write/read address generator coupled to the storage device, the write/read address generator having a read control input and a write control input;
   the write control input adapted to receive a FIFO write signal that causes the write/read address generator to control the storage device to store a signal output by the XOR logic device, in the storage device in the FIFO manner, the signal comprising the logical result of XORing the first and second X0R inputs to provide a parity bit signal;
   the read control input adapted to receive a FIFO read signal that causes the write/read address generator to control the storage device to output the parity bit signal stored in the storage device, in the FIFO manner.

10. The parity generator of claim 9, wherein each one of the n circuits further comprises a buffer coupled to the output of the parity bit storage device.

11. The parity generator of claim 10, wherein each one of the n circuits further comprises a first latch coupling the P words of the K data blocks to the first input of the XOR logic device.

12. The parity generator of claim 11, wherein each one of the n circuits further comprises a second latch coupling the output of the parity bit storage device to the second input of the XOR logic device and to the buffer.

13. The parity generator of claim 12, wherein each one of the n circuits further comprises a third latch coupling the second latch to the buffer.

14. The parity generator of claim 13, further comprising a state machine for generating signals for enabling and de-enabling the first, second, and third latches of the n circuits.

15. The parity generator of claim 14, further comprising a bus coupling the P words of the K data blocks to the first input of the XOR logic device and to the third latch of each one of the n circuits.

16. The parity generator of claim 13, further comprising a state machine for generating signals for enabling and de-enabling the first, second, and third latches of the n circuits and for asserting and de-asserting the FIFO write and FIFO read signals to cause each one of the n bits of the P words of the first K data block to be XORed with a logical zero output by the parity storage device of each one of the n circuits.

17. A parity generator for generating a block of m parity bits from a series of K data blocks, each one of the K data blocks comprising a series of m bits, the parity generator comprising:
   an XOR logic device including,
   a) a first input to receive a series of one bit parity_block signals,
   b) a second input coupled to the K data blocks to receive a series of input signals each input signal comprising one of the series of m bits of data comprising one of the K data blocks, and
   c) a parity bit output for outputting a series of one bit parity signals generated by the XOR logic device by performing a logical XOR operation on each one of the parity_block signals in the series of signals received by the first signal input, and each corresponding input signal in the series of input signals supplied to the second signal input of the XOR logic device; and
   a logic block comprising m one bit storage locations arranged in a FIFO data structure for storing the one bit parity signals output by the XOR logic device, the logic block includes
   a) a first input to receive a FIFO read enable signal, to enable the logic block to output one of m values stored in the logic block's m one bit storage locations as a function of the FIFO read enable signal and the FIFO data structure,
   b) a second input to receive a FIFO write enable signal, to enable the logic block to store the series of one bit parity signals output by the XOR logic device in one of the logic block's m one bit storage locations as a function of the FIFO write enable signal and the FIFO data structure,
   c) a parity bit input coupled to the parity bit output of the XOR logic device, and
   d) a parity_block signal output coupled to the first input of the XOR logic device and for outputting the series of m one bit parity signals stored in the logic block's m one bit storage locations.

18. A parity generator for generating a block of parity bits from a series of K data blocks, each one of the K data blocks comprising a series of m bits, the parity generator comprising:
   i) a buffer including,
      a parity_block signal input for receiving a series of parity_block signals,
      b) a parity generator parity signal output for outputting a series of one bit parity signals, and
      c) an enable input to receive an output enable signal, to enable the parity generator parity signal output as a function of the output enable signal;
   ii) an XOR logic device including,
      a) a first input to receive a series of one bit parity_block signals,
      b) a second input coupled to the K data blocks to receive a series of input signals, each one of the series of input signals comprising one of the series of m bits of data comprising one of the K data blocks, and
      c) a parity bit output for outputting a series of one bit parity signals generated by the XOR logic device by performing a logical XOR operation on each one of the parity_block signals in the series of parity_block signals received by the first signal input, and each corresponding input signal in the series of input signals supplied to the second signal input of the XOR logic device; and
   iii) a logic block comprising m one bit storage locations arranged in a FIFO data structure for storing the one bit parity signals output by the XOR logic device, the logic block includes
      a) a first input to receive a FIFO read enable signal, to enable the logic block to output one of m values stored in the logic block's m one bit storage locations as a function of the FIFO read enable signal and the FIFO data structure,
      b) a second input to receive a FIFO write enable signal, to enable the logic block to store the series of one bit parity signals output by the XOR logic device in one of the logic block's m one bit storage locations as a function of the FIFO write enable signal and the FIFO data structure,
      c) a parity bit input coupled to the parity bit output of the XOR logic device, and
      d) a parity_block signal output coupled to the first input of the XOR logic device and to the parity_block signal input of the buffer.

19. A parity generator for generating a block of m parity bits from a series of K data blocks, each one of the K data blocks comprising m bits arranged to form P words, each word having n bits the parity generator comprising:
   a bus comprising n lines coupled to the K data blocks;
   a plurality of n one bit parity generator circuits, each one of the n one bit parity generator circuits having an input and an output coupled to a respective one of the n lines of the bus, each one of the one bit parity generator circuits comprising,
   i) an XOR logic device including,
      a) a first input to receive a series of one bit parity_block signals,
      b) a second input coupled to the input of the one bit parity generator circuit to receive a series of input signals from the respective line of the bus, each input signal comprising one of the series of n bits comprising one of the P words of data comprising one of the K data blocks, and
      c) a parity bit output for outputting the series of one bit parity signals generated by the XOR logic device by performing a logical XOR operation on each one of the parity_block signals in the series of parity_block signals received by the first signal input, and each corresponding input signal in the series of input signals supplied by the line of the bus to the second signal input of the XOR logic device; and
   ii) a logic block comprising P one bit storage locations arranged in a FIFO data structure for storing the one bit parity signals output by the XOR logic device, the logic block includes,
      a) a first input to receive a FIFO read enable signal, to enable the logic block to output one of P values stored in the logic block's P one bit storage locations as a function of the FIFO read enable signal and the FIFO data structure,
      b) a second input to receive a FIFO write enable signal, to enable the logic block to store the series of one bit parity signals output by the XOR logic device in one of the logic block's P one bit storage locations as a function of the FIFO write enable signal and the FIFO data structure,
c) a parity bit input coupled to the parity bit output of the XOR logic device, and
d) a parity—block signal output coupled to the first input of the XOR logic device and coupled to the output of the one bit parity generator circuit.

20. The parity generator of claim 19 wherein each one of the n one bit parity generator circuits further comprises a buffer including:
a) a parity—block signal input coupled to the parity—block signal output of the logic block, for receiving the series of one bit parity—block signals output by the logic block,
b) an output coupled to the one bit parity generator circuit output for outputting the series of one bit parity—block signals received by the buffer, and
c) an enable input to receive an output enable signal to enable the output of the buffer as a function of the output enable signal.

21. The parity generator of claim 20 wherein each one of the n one bit parity generator circuits further comprises a first latch including:
a) an input coupled to the one bit parity generator circuit's input to receive the series of input signals from the bus,
b) a parity generator latch enable input for receiving an input latch enable signal enabling the first latch to store each one of the series of input signals received from the bus, sequentially, as a function of the input latch enable signal, and
c) an output coupled to the second input of the XOR logic device for outputting each one of the series of input signals received from the line of the bus.

22. The parity generator of claim 21 wherein each one of the n one bit parity generator circuits further comprises a second latch including:
a) a parity—block signal input coupled to the logic block's parity—block signal output to receive the series of one bit parity—block signals output by the logic block,
b) a latch enable input to receive a second—latch enable signal, to enable the second latch to store each one of the series of one bit parity—block signal output, sequentially, as a function of the
c) an output coupled to the first input of the XOR logic device and the parity—block signal input of the buffer for outputting the series of one bit parity—block signals received from the logic block's data signal output.

23. A computer system, comprising:
a bus comprising n data lines and a series of control lines;
a data storage device coupled to the bus for storing a series of K data blocks, each data block comprising m bits arranged to form P words, each one of the P words comprising a series of n bits;
a parity generator coupled to the bus for generating a block of m parity bits from the series of K data blocks, the parity generator comprising
a plurality of n one bit parity generator circuits, each parity generator circuit comprising,
i) an input and an output being coupled to a respective one of the n data lines of the bus,
ii) an XOR logic device including,
a) a first input to receive a series of one bit parity—block signals,
b) a second input coupled to the input of the one bit parity generator circuit to receive a series of input signals from the respective data line of the bus each input signal comprising a respective one of the series of n bits comprising one of the P words of data comprising one of the K data blocks, and
c) a parity bit output for outputting the series of one bit parity signals generated by the XOR logic device by performing a logical XOR operation on each one of the parity—block signals in the series of parity—block signals received by the first signal input, and each corresponding input signal in the series of input signals supplied by the respective line of the bus to the second signal input of the XOR logic device; and
iii) a logic block comprising P one bit storage locations arranged in a FIFO data structure for storing the one bit parity signals output by the XOR logic device, the logic block includes
a) a first input to receive a FIFO read enable signal, to enable the logic block to output one of P values stored in the logic block's P one bit storage locations as a function of the FIFO read enable signal and the FIFO data structure,
b) a second input to receive a FIFO write enable signal, to enable the logic block to store the series of one bit parity signals output by the XOR logic device in one of the logic block's P one bit storage locations as a function of the FIFO write enable signal and the FIFO data structure,
c) a parity bit input coupled to the parity bit output of the XOR logic device, and
d) a parity—block signal output coupled to the first input of the XOR logic device and coupled to the one bit parity generator output for outputting the series of one bit parity signals stored in the logic block's P one bit storage locations; and
a control logic block for controlling the operation of the parity generator, the control logic block comprising,
a) an input coupled to the bus's control and data lines for receiving control and data signals from the bus,
b) a FIFO read enable signal output coupled to the first input of each one of the n one bit parity generator circuits'logic blocks, and
c) a FIFO write enable signal output coupled to the second input of each one of the n one bit parity generator circuits'logic blocks.

24. A method for generating a block of m parity bits from a series of K data blocks, each one of the K data blocks comprising m bits, the method for generating the parity block comprising the steps of:
a) XORing every bit in the first of the series of K data blocks with logical "0" to create a current parity block;
b) storing the resulting current parity block in a FIFO data structure contained in a logic block comprising m one bit memory locations;
c) sequentially XORing the first through $m^{th}$bits of the stored parity block with the first through $m^{th}$bits of the next data block in the series of K data blocks not previously used in the XOR operation to form a new current parity block;

d) storing the new current parity block in the FIFO data structure;

e) repeating steps (c) and (d) until there are no remaining data blocks in the series of K data blocks upon which to perform the logical XOR operation, the stored parity block in the FIFO data structure comprising the parity block generated from the series of K data blocks.

25. A method for generating a block of m parity bits from a series of K data blocks, each one of the K data blocks comprising a series of n bits, the method comprising the steps of:

storing the n bits of a first one of the K data blocks in a FIFO manner;

sequentially reading each one of the stored n bits of the first one of the K data blocks in a FIFO manner;

for each read bit, XORing the read bit with a corresponding one of the n bits of a second one of the K data blocks, to provide a corresponding one of the n parity bits; and sequentially storing each one of the n parity bits in a FIFO manner.

* * * * *